(12) United States Patent
Zhuk et al.

(10) Patent No.: US 9,346,148 B2
(45) Date of Patent: May 24, 2016

(54) SUPERABRASIVE MATERIAL WITH PROTECTIVE ADHESIVE COATING AND METHOD FOR PRODUCING SAID COATING

(71) Applicant: Hardide plc, Bicester (GB)

(72) Inventors: Yuri Zhuk, Bicester (GB); Yuri Lakhotkin, Bicester (GB)

(73) Assignee: Hardide PLC, Bicester, Oxfordshire (GB)

( * ) Notice: Subject to any disclaimer, the term of this patent is extended or adjusted under 35 U.S.C. 154(b) by 156 days.

(21) Appl. No.: 13/864,984

(22) Filed: Apr. 17, 2013

(65) Prior Publication Data

US 2014/0290145 A1    Oct. 2, 2014

(30) Foreign Application Priority Data

Mar. 27, 2013   (GB) .................................. 1305637.9

(51) Int. Cl.
| | |
|---|---|
| *B24D 3/06* | (2006.01) |
| *B24D 18/00* | (2006.01) |
| *C23C 16/30* | (2006.01) |
| *C04B 41/00* | (2006.01) |
| *C04B 41/52* | (2006.01) |
| *C23C 28/00* | (2006.01) |
| *C04B 41/90* | (2006.01) |
| *C23C 16/02* | (2006.01) |
| *C23C 16/14* | (2006.01) |
| *C09K 3/14* | (2006.01) |

(Continued)

(52) U.S. Cl.
CPC ............. *B24D 3/06* (2013.01); *B24D 18/0072* (2013.01); *C04B 41/009* (2013.01); *C04B 41/5133* (2013.01); *C04B 41/52* (2013.01); *C04B 41/90* (2013.01); *C09K 3/1445* (2013.01); *C23C 12/02* (2013.01); *C23C 16/0272* (2013.01); *C23C 16/14* (2013.01); *C23C 16/30* (2013.01); *C23C 24/085* (2013.01); *C23C 28/027* (2013.01); *C23C 28/324* (2013.01); *C23C 28/341* (2013.01); *C23C 28/347* (2013.01); *C23C 28/36* (2013.01); *C23C 28/42* (2013.01)

(58) Field of Classification Search
CPC ................................ C03C 17/00; C23C 16/30
See application file for complete search history.

(56) References Cited

U.S. PATENT DOCUMENTS

| | | | |
|---|---|---|---|
| 5,346,719 A | 9/1994 | Zarnoch et al. | |
| 5,785,039 A * | 7/1998 | Kobayashi et al. | 125/39 |
| 6,524,357 B2 | 2/2003 | Baldoni et al. | |
| 6,800,383 B1 | 10/2004 | Lakhotkin et al. | |
| 7,022,403 B1 | 4/2006 | Lakhotkin et al. | |

(Continued)

OTHER PUBLICATIONS

International Search Report and Written Opinion of counterpart International Application No. PCT/GB2014/050960, mailed Jul. 3, 2014, 9 pp.

*Primary Examiner* — Pegah Parvini
*Assistant Examiner* — Alexandra M Moore
(74) *Attorney, Agent, or Firm* — Shumaker & Sieffert, P.A.

(57) ABSTRACT

A coating on mono- or poly-crystalline diamond or diamond-containing material includes a first adhesive layer formed directly on the diamond or diamond-containing material, the first layer including tungsten and tungsten carbide alloyed with fluorine in an amount of 0.001 to 0.12 wt % calculated on the total weight of the first layer. The coating further includes a second protective layer formed on the first layer, the second layer including at least tungsten alloyed with fluorine in an amount of 0.001 to 0.12 wt % calculated on the total weight of the second layer. The adhesive layer provides excellent bond strength to diamond, while the protective layer provides good protection against oxidation and molten metals used for attaching the coated diamonds to tools.

37 Claims, 6 Drawing Sheets

(51) Int. Cl.
*C04B 41/51* (2006.01)
*C23C 12/02* (2006.01)
*C23C 28/02* (2006.01)
*C23C 24/08* (2006.01)
*B24B 1/00* (2006.01)

(56) References Cited

U.S. PATENT DOCUMENTS

2005/0158589 A1* 7/2005 Lakhotkin et al. ............ 428/698
2009/0117372 A1 5/2009 Zhuk et al.

* cited by examiner

SUPERABRASIVE MATERIAL WITH PROTECTIVE ADHESIVE COATING AND METHOD FOR PRODUCING SAID COATING

This disclosure relates to coated diamond super-hard materials, a process for their coating and to coated diamonds for use in wear-resistant materials, hard facing and abrasive-containing tools.

BACKGROUND

Diamond is the hardest known material, widely used in industry both in tools for cutting, drilling and other operations, and in parts subject to wear. However, diamond use and performance in these applications can be restricted by several properties of diamonds. Firstly, diamonds are difficult to attach to tools or wear parts, due to the chemical inertness of diamond and also its poor wettability by molten metals. Secondly, diamonds can be oxidised or graphitized at the elevated temperatures often encountered during the manufacture or operation of such tools or wear parts. Graphitization is the transformation of hard diamond into soft graphite, and occurs at elevated temperatures when diamond is in contact with nickel, cobalt, iron and other metals that are catalysts of the diamond graphitization process. These metal catalysts are often used during the manufacture of synthetic diamonds and when sintering polycrystalline diamonds, and also are present in the cemented carbide parts often used to support diamonds, for example in oil drill bits incorporating polycrystalline diamond cutters. When diamonds are in contact with these metals, they become susceptible to graphitization, and this limits the maximum temperatures at which these can be used to below 400 to 500° C. This not only limits the use of the diamond tools, but it also restricts the use of high temperature manufacturing processes such as casting, brazing, and thermal spraying often employed in the production of oil drilling tools, stone cutting saws and other diamond tools and wear parts. Molten iron-group metals can quickly dissolve diamond even through a limited contact area.

Previous attempts to use coatings to improve the retention of diamonds and at the same time to protect diamonds from oxidation and graphitization have not produced satisfactory results.

BRIEF SUMMARY OF THE DISCLOSURE

Viewed from a first aspect, there is provided a coating on mono- or poly-crystalline diamond or diamond-containing material, the coating comprising a first adhesive layer formed directly on the diamond or diamond-containing material, the first layer comprising tungsten and tungsten carbide alloyed with fluorine in an amount of 0.001 to 0.12 wt % calculated on the total weight of the first layer; and a second protective layer formed on the first layer, the second layer comprising at least tungsten alloyed with fluorine in an amount of 0.001 to 0.12 wt % calculated on the total weight of the second layer.

The second layer may include tungsten and tungsten carbide alloyed with fluorine in an amount of 0.001 to 0.12 wt % calculated on the total weight of the second layer, which has been found to improve the adhesive, mechanical and protective properties of the coating. In some embodiments, a fluorine content below 0.001 wt % can be insufficient to achieve the effect of enhancing tungsten reactivity and strengthening the mechanical and protective properties of the coating. In some embodiments, a fluorine content above 0.12 wt % was found to raise a risk of excess fluorine causing degradation of the adhesion and cohesion of the coating, especially if the coated diamonds are used at elevated temperatures and in the presence of water or oxygen.

The first layer typically has a finer crystalline structure than the second layer, which may in some embodiments help to provide improved protection for the underlying diamond.

Carbon in the tungsten carbide of the first layer will generally be derived from the diamond or diamond-containing material on which the first layer is formed, which in some embodiments helps to promote strong adhesion of the first layer to the diamond substrate.

In some embodiments, the first and/or the second layers are chemically-deposited layers as opposed to physically-deposited layers.

The first layer may include at least one of tungsten monocarbide (WC) and tungsten semicarbide ($W_2C$).

The first layer may have a thickness of 0.1 to 4 μm.

The first layer may consist essentially of metal tungsten (W), tungsten monocarbide (WC) and tungsten subcarbide ($W_2C$), mixed in a composite layer, all alloyed with fluorine in an amount of 0.001 to 0.12 wt %. In some embodiments, the first layer has a ratio of WC:$W_2C$:W in a range (1-100):(5-20):(1-100).

The second layer may include at least one of tungsten monocarbide (WC) and tungsten semicarbide ($W_2C$).

Some embodiments include an absence of brittle tungsten subcarbides such as $W_3C$ and/or $W_{12}C$.

The second layer may include tungsten carbide nanoparticles dispersed in a matrix of metal tungsten, alloyed with fluorine in an amount of 0.001 to 0.12 wt %.

The second layer may itself be formed as a plurality of alternating sublayers of tungsten carbide alloyed with fluorine and tungsten alloyed with fluorine. The sublayers of tungsten carbide alloyed with fluorine may each be less than 4 μm in thickness. Alternatively, the second layer may itself be formed as a plurality of alternating sublayers of tungsten alloyed with fluorine, and tungsten carbide nanoparticles dispersed in a matrix of metal tungsten, alloyed with fluorine. The sublayers of tungsten carbide nanoparticles dispersed in a matrix of metal tungsten may each be less than 4 μm in thickness. The sublayers may have a respective thickness ratio from 10:1 to 1:10.

The second layer may have a thickness of 0.5 to 500 μm, preferably of 3 to 50 μm.

The coating may be formed on diamond or diamond-containing material comprising diamond, mono-crystalline diamond, poly-crystalline diamond, diamond-silicon carbide composites or other diamond-containing materials substantially free from metal catalysts and is thermally stable at temperatures up to at least 800° C.

The diamond or diamond-containing material may be substantially completely coated. Alternatively, it may be substantially completely coated except for portions where it has been held during coating, for example by way of tongs, clamps, forceps or the like.

The first and second layers are preferably substantially free from through porosity and/or through cracks.

The first and second layers may together consist of 93.88 to 99.95 wt % tungsten.

The first and second layers are preferably free from non-refractory binder materials.

The coating may have a hardness from 4.0 to 25 GPa, preferably from 6 to 18 GPa.

Viewed from a second aspect, there is provided a superabrasive element comprising mono- or poly-crystalline diamond or diamond-containing material coated with the coating of the first aspect.

Viewed from a third aspect, there is provided a cutting or drilling tool incorporating at least one superabrasive element of the second aspect.

Viewed from a fourth aspect, there is provided a method for producing a cutting or drilling tool of the third aspect, wherein the superabrasive element is attached to a tool substrate by wetting the second, protective layer of the coating with molten metal. The metal may be selected from the group comprising: cobalt, nickel, iron, copper, titanium, silver, gold, aluminium, indium and alloys containing at least two of these metals. The molten metal may be applied by way of infiltration, casting, brazing, spraying, welding, soldering, Hot Isostatic Pressing (HIP) or High Temperature High Pressure (HTHP) cycling.

Viewed from a fifth aspect, there is provided a method of applying a coating to a substrate comprising mono- or polycrystalline diamond or diamond-containing material, wherein a first adhesive layer is formed directly on the substrate by a first stage chemical deposition process, the first layer comprising tungsten and tungsten carbide alloyed with fluorine in an amount of 0.001 to 0.12 wt % calculated on the total weight of the first layer and wherein a second protective layer formed on the first layer by a second stage chemical deposition process, the second layer comprising at least tungsten alloyed with fluorine in an amount of 0.001 to 0.12 wt % calculated on the total weight of the second layer.

BRIEF DESCRIPTION OF DRAWINGS

Embodiments of the invention are further described hereinafter with reference to the accompanying drawings, in which.

DETAILED DESCRIPTION

The first stage chemical deposition process may comprise placing the substrate in a carbon-free solid powder medium comprising metallic tungsten powder and fluorides (the fluorides in an amount of 0.1 to 10 wt %), heating in a vacuum or an inert gas atmosphere, and holding at a temperature of 800 to 1050° C. for at least 10 minutes to form the first adhesive layer. Due to the extremely low vapour pressure of tungsten, it is difficult to apply this refractory metal coating by evaporation/condensation at temperatures that diamond can withstand without degradation. Instead, a tungsten fluoride diffusion process is used, and during this diffusion process treatment, tungsten fluorides are transferred through the vapour phase from the surfaces of tungsten particles to the surface of the diamond, where tungsten fluorides are reduced by carbon from the diamond surface, forming tungsten carbides as well as tungsten. This is a chemical process, involving formation and reduction of tungsten fluorides and tungsten carbides, where fluorine plays a key role as a transport agent. The composition and structure of the first coating layer are determined by the balance of the complex simultaneous and interconnected processes of tungsten transfer through the vapour phase, reduction of tungsten and formation of tungsten carbides. The optimal regimes for deposition of this first coating layer were developed via extensive experimentation, and included determining the process temperature, heating and cooling rates, pressure and composition of the solid powder medium best suited to achieve the target coating parameters.

Other chemical methods of producing the first coating layer can also be used, such as Chemical Vapour Deposition, electrolysis of molten salts of tungsten, and reaction of tungstic acid salts in the presence of fluorides.

In a CVD process, the first stage chemical deposition process may comprise placing the substrate in a gaseous medium comprising $WF_6$ and hydrogen at a volumetric ratio of tungsten hexafluoride to hydrogen from 0.6 to 0.1, at a temperature of 400 to 600° C. and a pressure of 0.5 to 20 kPa for at least 2 minutes to produce a layer of tungsten alloyed with fluorine in an amount from 0.001 to 0.12 wt %, with a thickness of at least 0.1 μm, followed by heat treatment at a temperature between 800° C. and 1000° C. for at least 10 minutes to form the first adhesive layer.

In an alternative CVD process, the first stage chemical deposition process may comprise placing the diamonds or diamond-containing substrate in a gaseous medium comprising $WF_6$ and hydrogen, at a temperature of 350 to 600° C. and a partial pressure of 0.1 to 20 kPa with a volumetric ratio between $WF_6$ and hydrogen ranging from 3:5 to 1:10 for at least 3 minutes to form the first coating layer. The resulting thin layer of tungsten alloyed with fluorine can then be heat treated at a temperature in excess of 800° C. to achieve interdiffusion of the tungsten metal and carbon from the diamond surface, and also a reaction between tungsten and carbon producing tungsten carbides.

The layer of tungsten alloyed with fluorine may be applied to a thickness up to 50 μm.

Other chemical methods of producing the first coating layer have also been investigated, including electrolysis of molten salts of tungsten and the reaction of tungstic acid salts in the presence of fluorides. Electrolysis of triple fluoride eutectic LiF—NaF—KF was conducted in a rotating graphite crucible at a temperature of 760-780° C. and a current density of 500 A/m². Other salt melts can also be used, such as wolframic melt 79% NaCl+20% $Na_2WO_4$+1% $Na_2CO_3$. At 850° C. and a current density up to 6000 A/m² a dense layer of Tungsten was produced with a thickness of 5-6 μm in a single electrolysis cycle.

Tungsten layer deposition by a reaction of tungstic acid salts in the presence of fluorides uses a mixture of the salts $KWO_4$ and KF, which is applied on the surface of diamonds, and then heated in an atmosphere of inert gas with hydrogen to 500-1200° C. As a result of the reactions, a layer of tungsten oxide alloyed with fluorine is produced on the diamond surface. This tungsten oxide is then reduced by hydrogen to metal tungsten alloyed with fluorine. Fluorine is the most electronegative element with an extremely high electron affinity. When fluorine is present as an alloying element in optimal amounts, it reduces the temperature of the reduction of tungsten oxides by hydrogen. At the same time, carbon diffusion into tungsten and chemical reactions between carbon and tungsten result in the formation of tungsten carbides on the boundary between the diamond surface and the tungsten layer.

The first coating layer can also be produced by other methods, such as Physical Vapour Deposition (PVD), electrochemical and electroless deposition of tungsten from solutions.

By way of extensive experimentation conducted by the present Applicant, it was surprisingly found that to achieve optimal mechanical and chemical properties, the coating on diamonds should contain fluorine in amounts ranging from 0.001 to 0.12 wt % calculated on the total weight of the first layer. In addition to acting as a tungsten transport agent, fluorine when present in optimal amounts enhances the reactivity of tungsten with carbon as well as the mechanical properties of tungsten. It is known that pure tungsten reacts with carbon (as graphite) to form tungsten carbides at temperatures above 1050° C. in a process called carburization [Tungsten Properties, Chemistry, Technology of the Element, Alloys and Chemical Compounds, Erik Lassner, Wolf-Dieter Schubert, Kluwer Academic, 1999]. Pure tungsten also reacts with carbon (as diamond) above 1000° C., but this high temperature can cause diamond degradation, especially of polycrystalline sintered diamonds and synthetic diamond grit with residual catalysing metals. Because fluorine is the most electronegative element with one of the highest electron affinity values (3.45 eV (340 kJ/mole)) among chemical elements, it is considered to be the most powerful oxidizing element. By attracting electrons from surrounding atoms, such as tungsten atoms, fluorine increases the reactivity of tungsten and thus reduces the temperature of its chemical reactions, at least when fluorine is present as an alloying element in tungsten in an optimal concentration.

From experimentation, it was found in some cases that a fluorine concentration below 0.001 wt % was too low to have any significant effect on the reactivity of tungsten. Moreover, when fluorine is present in and amount more than 0.12 wt %, it can is some cases cause undesirable chemical transformations to the tungsten, especially at elevated temperatures and in the presence of water or oxygen. Both the diffusion process of forming the first coating layer described in this application and other methods such as CVD followed by heat treatment were developed to achieve this optimal alloying concentration of fluorine between 0.001 wt % and 0.12 wt %. This allows enhanced reactivity of alloyed tungsten with diamond carbon to be achieved, and the production of tungsten carbides at lower temperatures in the range of 800 to 970° C. This lower formation temperature of tungsten carbides does not damage many of the grades of the industrial diamonds, such as diamond grit and TSP polycrystalline diamonds. The formation of tungsten carbides is essential to form strong chemical bonds between the tungsten coating and the diamond surface.

The second stage chemical deposition process may comprise placing the substrate coated with the first adhesive layer in a gaseous medium comprising $WF_6$, hydrogen and optionally hydrocarbons, at a temperature of 350 to 600° C. and a partial pressure of 0.1 to 20 kPa for at least 10 minutes to form the second protective layer.

At least one of the coatings may be deposited by way of vapour phase deposition, the vapour being non-ionized and chemically active during the deposition process, with the substrate being moved during the deposition process so as to obtain complete coating over the entire substrate surface.

The substrate may comprise diamond or diamond-containing grit or elements.

In certain embodiments, diamond grains and polycrystalline diamond parts are coated with a thick (typically up to 100 μm) pore-free coating which contains both tungsten and tungsten carbides, applied by a chemical method such as Chemical Vapour Deposition (CVD) (in contrast to the physical deposition method of WO 2005/078041). Due to the crystallization of the coating from the gas phase, CVD methods allow uniform coating of complex shapes and porous surfaces, such as polycrystalline diamond parts, with the coating even penetrating inside the pores and sealing smaller pores. During the CVD coating crystallization of tungsten and tungsten carbide, tungsten atoms produced on the growing surface as a result of chemical reactions have high mobility, thus filling the low energy positions in the coating structure, producing a substantially pore-free layer. This coating has significantly better protective properties against molten metals and other aggressive media.

The coating of embodiments of the present application always contain tungsten carbides, first of all as an innermost layer of the coating formed using carbon from the diamond surface and thus forming a strong chemical adhesion bond. Some coating variants may also include tungsten carbide dispersed in a metal tungsten matrix and layers of tungsten carbide disposed between layers of tungsten.

The present Applicant has undertaken extensive experimentation and testing, and has found that the optimal coating for diamonds should have sufficient thickness to protect the diamond against aggressive metals, be free from brittle tungsten subcarbide phases, and especially should avoid deposition of these phases as continuous layers prone to fracture failure. The internal layer of the optimal coating should have a composite structure rather than a layered structure. The composite structure preferably consists of a dispersed mixture of all three phases: tungsten monocarbide WC, tungsten semicarbide $W_2C$ and metal tungsten; this gives the coating the combination of enhanced toughness with high hardness. The external layer of an optimal coating must have sufficient hardness to resist abrasion/erosion. All these conclusions resulted in the development of the new protective adhesive coating disclosed in this application.

The coating of the present application has been developed to help protect the diamond from oxidation and also from attack by aggressive metal bonds, such as cobalt, nickel or iron, which have catalytic properties and can cause diamond conversion into soft graphite—an effect called "graphitization"—which is detrimental to the diamond wear resistance. The coating is intended to enhance diamond retention within tools, as the innermost layer of the coating has a strong chemical bond to the diamond, and its external layer has good wettability with molten metal bonds, brazing and casting alloys used in diamond tools.

Coatings of the present application can be used (without limitation) to protect monocrystalline diamonds, diamond grit, polycrystalline diamonds, Thermally Stable Products (TSP), diamond-silicon carbide composite elements, silicon cemented diamond and other diamond-containing materials, which thermally stable at a temperature of at least 800° C.

By way of extensive experimentation, it was surprisingly found that to provide optimal protection for diamonds and diamond-containing materials, the coating ideally required a combination of properties and characteristics, including the following:

1. Strong adhesion bond of the coating to diamond.
2. The coating method should achieve continuous coating of the majority of the grain surface of the diamond grit or the whole surface of polycrystalline diamond parts.

3. Sufficient thickness and suitable structure to prevent diffusion of molten metals to the diamond.

4. The coating should be substantially free from porosity and micro-cracks, which can let oxygen or molten metals attack the diamond.

5. The coating should have a coefficient of thermal expansion (CTE) close to the CTE of diamond or the diamond-containing material to reduce stresses.

6. Sufficient hardness to resist mechanical abrasion, but also enhanced toughness and ductility to prevent brittle failure and micro-cracking of the coating during mechanical or thermal shocks.

7. The external surface of the coating should have good wettability by molten metal binders, brazing and casting alloys.

The coating of embodiments of the present application, which was developed after extensive experimentation, consists of partially-carbided tungsten, alloyed with fluorine. Methods of producing this coating achieve a strong chemical bond of the coating to the coated diamonds, by forming a layer of tungsten carbide formed by the chemical reaction of tungsten with carbon from the diamond surface.

The methods enable the production of thick coatings with thicknesses up to 150 µm, in some cases up to 500 µm, substantially free from porosity and micro-cracks. These thick and pore-free coatings form a strong barrier against diamond oxidation or diffusion of molten metals which can cause diamond graphitization.

Some prior art methods of coating diamonds use physical vapour deposition (PVD) techniques which can coat only line-of-sight areas and are not able to coat inside pores with a high aspect ratio of pore depth to diameter. Some polycrystalline diamond materials, such as TSP diamonds or fully-leached polycrystalline diamond disks, can have very deep pores with intricate shapes when the catalysing metal binder used to produce these polycrystalline parts is leached off. Other prior art methods for coating diamonds or metal parts allow the coating of stationary parts, with some areas used to support these parts during coating deposition remaining uncoated. The resulting porosity in the coating or the uncoated areas do not provide the necessary degree of protection against oxidation and molten metals, which can penetrate through the coating porosity and cause diamond graphitization.

To resolve this problem, the method of chemical deposition or CVD was found most suitable to produce the required thick, pore-free coating. Chemical deposition allows conformal coating of non-line-of-sight areas, including deep intricate pores. In one embodiment, the superabrasive elements are moved at certain stages of the coating deposition, thus enabling these elements to be coated over all or most of their surface, for example with at least 90% of the total surface area being coated.

Some embodiments of the coatings of the present application combine enhanced hardness with toughness. This is necessary to protect diamond elements from erosion during the metal-spraying processes often used during hard-facing, and also from abrasion and erosion of the diamond-containing hard facing during its operation, for example on an oil drilling tool.

Single-stage coating depositions can usually only produce thin coatings (typically a few micrometers, maximum 10 µm) which may not give sufficient protection for the diamond. Such coatings may also have non-optimal composition and structure, since the single-stage coating deposition does not provide full flexibility in controlling or modifying the coating characteristics.

The coating of embodiments of the present application has two layers: an inner adhesive layer with a strong chemical adhesion bond to diamond, and an outer protective layer. These layers may be produced in two separate processes: the inner adhesive layer can be produced by a diffusion method or by a CVD process followed by heat treatment, and the outer protective layer can be produced by a chemical method, such as Chemical Vapour Deposition (CVD). This allows the building of much thicker coatings with significantly lower internal stresses due to thermal expansion mismatch. Using two separate coating deposition processes also provides much better control over the phase composition and structure of each of the two layers, which can be optimised independently from each other as detailed below.

The inner adhesive layer, which is applied directly on the diamond or diamond-containing material, may consist essentially of tungsten monocarbide (WC), tungsten semicarbide ($W_2C$) and metal tungsten, mixed in a composite layer, all alloyed with fluorine present in an amount of 0.001 to 0.12 wt %. Extensive experimentation determined that the adhesive layer was advantageously free from tungsten subcarbide phases $W_3C$ and $W_{12}C$, which have poor mechanical properties, are brittle and have high residual stresses. The inner adhesive layer may be produced by a diffusion method, which may be optimised to achieve a target layer composition and structure. In particular, in order to prevent or at least suppress the formation of brittle subcarbide phases $W_3C$ and $W_{12}C$, the diffusion process temperature should be at least 800° C.

A solid powder medium charge may be used to produce the inner adhesive layer, the charge containing metal tungsten powder and fluorides in an amount from 1 to 10% wt. This not only enables the formation of the inner adhesive layer in a composition free from brittle tungsten subcarbide phases, but also enables an improved structure for the inner layer to be realised. Some diamond coatings include an inner adhesive layer with a layered phase structure, including a first innermost layer of tungsten monocarbide WC, a second layer of tungsten semicarbide $W_2C$ deposited over the first layer, further layers of tungsten subcarbides $W_3C$ and $W_{12}C$ over the previous layers, and finally a layer of metal tungsten. It has been found that this layered structure may not always have ideal mechanical properties, and in some implementations can be brittle and have high mechanical stresses. The present coating, in contrast, has a composite structure where different phases (including WC, $W_2C$ and metal tungsten) are mixed together rather than layered on top of each other. This mixed composite structure allows coating hardness and mechanical strength to be combined with enhanced toughness and ductility. In addition, there is a reduction in mechanical and thermal expansion mismatch stresses during deposition of the coating and the use of diamonds coated with the coating. After extensive experimentation, appropriate regimes of producing the inner adhesive layer were developed, which result in a coarser morphology of the newly-developed inner adhesive layer. Unlike the smooth morphology of some layered coatings, this coarser morphology provides a stronger adhesion bond to diamonds and diamond-containing materials and also provides a keying surface for a stronger adhesion bond of the external protective layer to the inner layer. The inner adhesion layer is still finer than the external protective layer.

The outer, protective layer of the present coating is produced mainly or substantially by way of chemical deposition, which in contrast to physical deposition methods allows a continuous and uniform coating of the majority of the superabrasive element surface to take place, including coating inside open pores. Polycrystalline diamonds, such as Thermally Stable Product (TSP), can be sintered from diamond grit using catalysing metals usually from the iron group, such as nickel, cobalt or iron, which act as a solvent during sintering to fuse individual diamond grains together. Catalysing metal that may remain in the interstitial pores between the sintered diamond grains can then be leached away to improve the thermal stability of the TSP. Catalyst-free TSP diamonds can withstand temperatures in excess of 1000° C., which would cause diamond graphitization if the metal catalyst remained in contact with diamond. TSP diamonds are sometimes infiltrated with a non-catalysing filler, such as silicon, but their surfaces tend to remain uneven and porous, and difficult to attach to a metal tool body. Preferred embodiments of the present coating are substantially pore-free and crack-free, and have sufficient thickness to seal the interstitial porosity in the polycrystalline diamonds and diamond-containing materials. This prevents infiltration of the molten metal binder (such as brazing alloy, cobalt binder, metal infiltrant alloys) into the interstitial pores. Consequently, this can enhance the thermal stability of polycrystalline diamond tools, as most of these metal binders have thermal expansion coefficients (TECs) substantially higher than the TEC of diamond, and can mechanically rupture the polycrystalline diamond at elevated temperatures.

Thermal metal spraying is often used as part of the process for attaching diamonds as hard-facing on the surface of oil drilling string stabilizers. To protect diamonds from oxidation and also from mechanical erosion by the sprayed molten metal, the coating should have sufficient erosion resistance. Coated polycrystalline superabrasives on the wear surfaces of oil drilling tools and in other applications are exposed to highly abrasive and erosive conditions, for example being abraded against rock formations and being exposed to high velocity flows of drilling mud carrying sand and stone chippings. The coated polycrystalline superabrasives are also exposed to impact and shock loads. If the coating is not able to resist these abrasive and erosive conditions, or is too brittle and fractures under shock load, then the coated superabrasive element can be lost. Erosion and abrasion resistance of the coating are important when diamonds with thick protective coatings are used in diamond tools, since selective erosion or abrasion of the coating layer can gradually form a gap between the diamond and the tool matrix, and this gap can weaken retention of the diamond and can lead to loss of the diamond. In order better to resist erosion and abrasion, the coating should combine enhanced hardness with toughness and ductility. This combination of hardness with toughness has been found by the present Applicant to give the best overall protection resisting various mechanisms of wear and erosion: the enhanced hardness inhibits micro-cutting mechanisms of wear and erosion, while the coating toughness and ductility prevent fatigue micro-cracking/chipping and platelet mechanisms of erosion. Extremely hard but brittle materials such as binder-free tungsten carbide are likely to fail due to brittle fracture, and are known to fail in erosive conditions under high angles of attack due to micro-cracking Tough and ductile materials with low hardness are known to fail under low angle erosion due to micro-cutting actions, and are expected to wear in abrasive environments. Thermo-mechanical stresses due to thermal expansion/contraction mismatch between the coating and the substrate, as well as thermal shock combined with mechanical impact during metal spraying, also require sufficient ductility and toughness of the coating, as brittle coatings are likely to fracture.

Toughness and ductility of the coating are also essential for applications where diamond tools can suffer from shock loads and impact, such as oil drilling tools. Brittle coatings such as pure tungsten carbide can fracture after impact. Even a micro-crack can become a stress concentrator when the tool is used with high shear loads applied to diamonds, and can quickly develop through the brittle coating material, resulting in separation of the diamond from the tool. Loss of one such superabrasive element can increase the mechanical shear load on the neighbouring elements. Such loss can also interrupt the cutting action and increasing shock loads on the next most exposed superabrasive element, which then becomes more likely to fail, leading to a "domino" effect and premature failure of the whole hard-facing area.

To resist these conditions, an optimal coating should combine sufficient hardness to resist abrasive wear with enhanced toughness and ductility to resist impact. By way of extensive experimentation and testing, it was found that coatings including both tungsten carbide and metal tungsten in predetermined proportions and also with certain material structures, may demonstrate such a combination of properties. Tungsten carbide provides enhanced hardness and metal tungsten provides toughness and ductility. To achieve improved performance, these composite protective coatings of embodiments of the present application can have one of two specific structures.

In one embodiment the coating has a layered structure with alternating thin layers consisting predominantly of metal tungsten and of tungsten carbide or a mixture of tungsten with tungsten carbides. The overall hardness and toughness of the layered coating can be controlled by adjusting the thicknesses of the individual layers, their ratios and the phase composition of individual layers. In preferred embodiments, excellent protective properties can be achieved with a ratio of the thicknesses of individual tungsten and tungsten carbide-containing layers ranging from 1:10 to 10:1. The total thickness of these coatings can be up to 50 µm, in some cases up to 100 µm, and in some cases where extremely thick coatings are required up to 500 µm, and the overall hardness of this type of multi-layer coating can be in the range from 4 to 25 GPa, preferably 6 to 18 GPa.

In another embodiment, the coating comprises tungsten carbide nano-particles dispersed in a metal tungsten matrix. In this embodiment, the overall hardness and toughness of the composite coating can be controlled by varying the amount of tungsten carbide nano-particles, along with their size and phase composition. Preferred embodiments have excellent protective properties when the hardness is in the range of 6 and 18 GPa, and the coating thickness up to 100 µm, in some cases where extremely thick coating is required up to 500 µm.

The coatings for diamonds can have a thinner (typically less than 10 µm) outer layer made of physically-deposited tungsten that is free of tungsten carbides. This does not provide the same resistance to abrasive wear and erosion, nor does it provide the same degree of protection of the coated diamonds from attacks by molten metals.

For example, in comparison to the coatings disclosed in U.S. Pat. No. 5,346,719, the coatings of the present disclosure have a number of distinguishing features:

| | U.S. Pat. No. 5,346,719 | Present disclosure (first adhesive layer applied by CVD) |
|---|---|---|
| Coated Substrate | CVD Diamond sheets | Mono- or poly-crystalline diamond or diamond-containing material |
| Thickness of the first layer | 10-10,000 Angstroms (0.001-1 µm), preferably 200 Angstroms (0.02 µm) | 0.1-4 µm |

-continued

|  | U.S. Pat. No. 5,346,719 | Present disclosure (first adhesive layer applied by CVD) |
|---|---|---|
| Ratio of WF$_6$/H$_2$ | 1:12 | From 3:5 to 1:10 |
| Heat treatment T | 700° C. to 1200° C. | 800° C. to 1000° C. |
| CVD temperature | 300 to 700° C. | 400 to 600° C. |
| CVD pressure | 0.1 torr to 3 torr (0.013-0.4 kPa) Preferably 0.5 torr (0.065 kPa) | 0.5-20 kPa |
| Fluorine content | Not specified At the process conditions described above the fluorine content is likely to be outside the range from 0.001 wt % to 0.12 wt % | 0.001 wt % to 0.12 wt % |
| External layer composition | Tungsten | Tungsten alloyed with fluorine, in some embodiments also contains tungsten carbides Wc, W$_2$C |

The different process conditions, and the different thickness and composition of the present coating, are to achieve complete coverage of a diamond surface with tungsten alloyed with a specified amount of fluorine.

Figure 1:
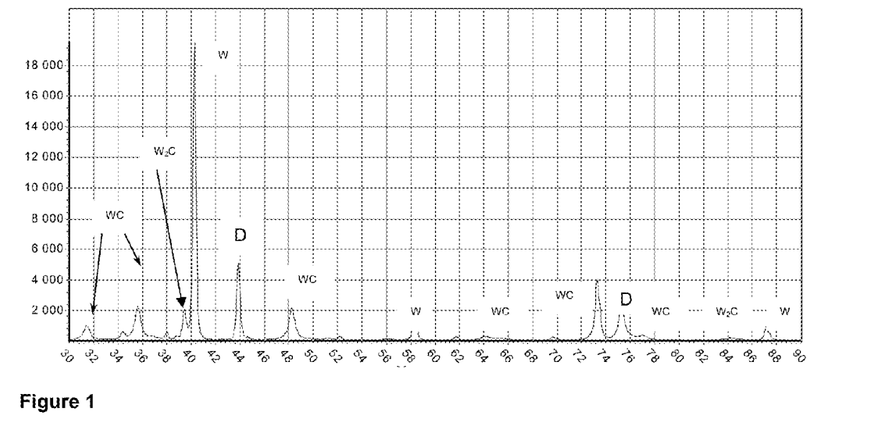
FIG. 1 is an X-ray diffraction spectrum for a first stage coating layer described in Example 1.

FIG. 1 shows an X-ray diffraction (XRD) spectrum of a first layer, adhesive coating with thickness 0.9 µm as described in Example 1 below. This first layer coating consists of a mixture of metal tungsten W with tungsten carbides W$_2$C and WC. Because the coating is thin, the X-ray diffraction instrument also records the diamond substrate lines marked "D". This XRD spectrum is typical for the first adhesive coating layer as described in the present application.

Figure 2:
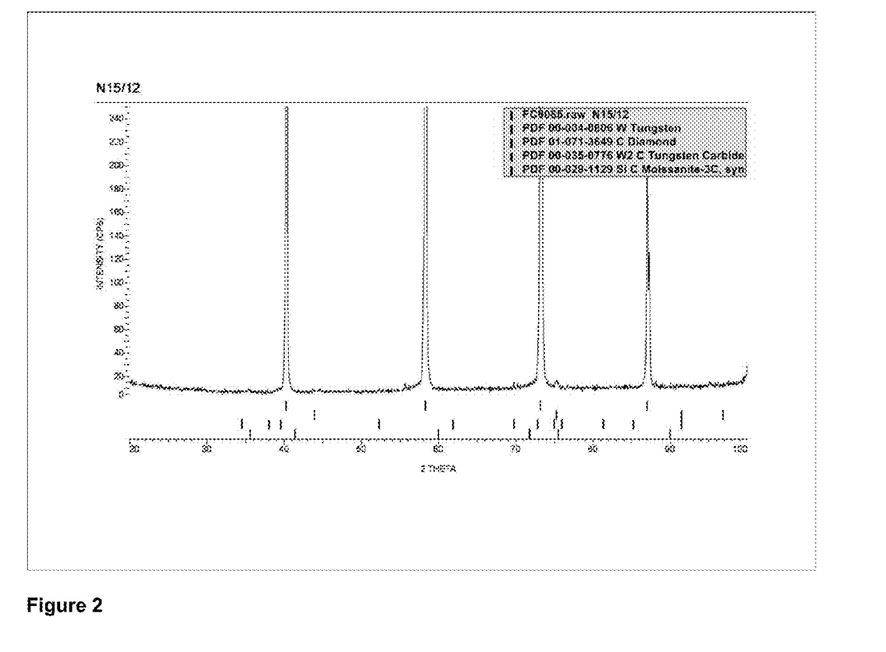
FIG. 2 an X-ray diffraction spectrum for a second coating layer after the second stage coating described in Example 1, the second layer comprising predominantly pure tungsten.

FIG. 2 shows a typical XRD pattern for a two-layer coating having a second, protective layer of substantially pure tungsten alloyed with fluorine having a thickness of around 20 µm. The positions of the characteristic lines of the following materials are shown beneath the spectrum:
Top row: Tungsten W;
Second row: Diamond C;
Third row: Tungsten Carbide W$_2$C;
Fourth row: Silicon Carbide SiC.
Because the second coating layer is relatively thick, neither the diamond or SiC substrate lines nor the tungsten carbide lines from the first coating layer are visible.

Figure 3:
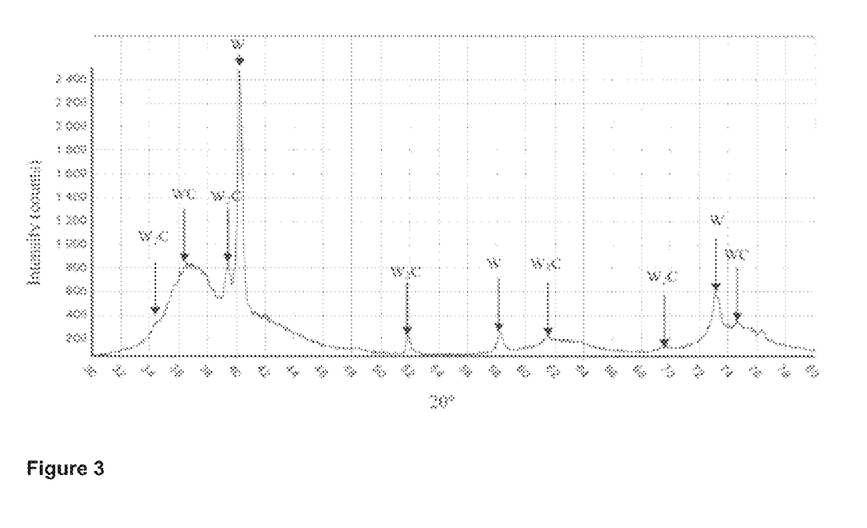
FIG. 3 an X-ray diffraction spectrum for a second coating layer after a second stage coating described in Example 9, the second layer comprising metal tungsten, tungsten monocarbide WC and tungsten semicarbide $W_2C$.

FIG. 3 shows a typical XRD pattern for a two-layer coating with the second, protective layer comprising a multi-layer coating of W+W$_2$C+WC with a thickness of 16.5 µm, as described in Example 9. Again, because the second layer is relatively thick, diamond substrate lines are not visible in the spectrum.

Figure 4:
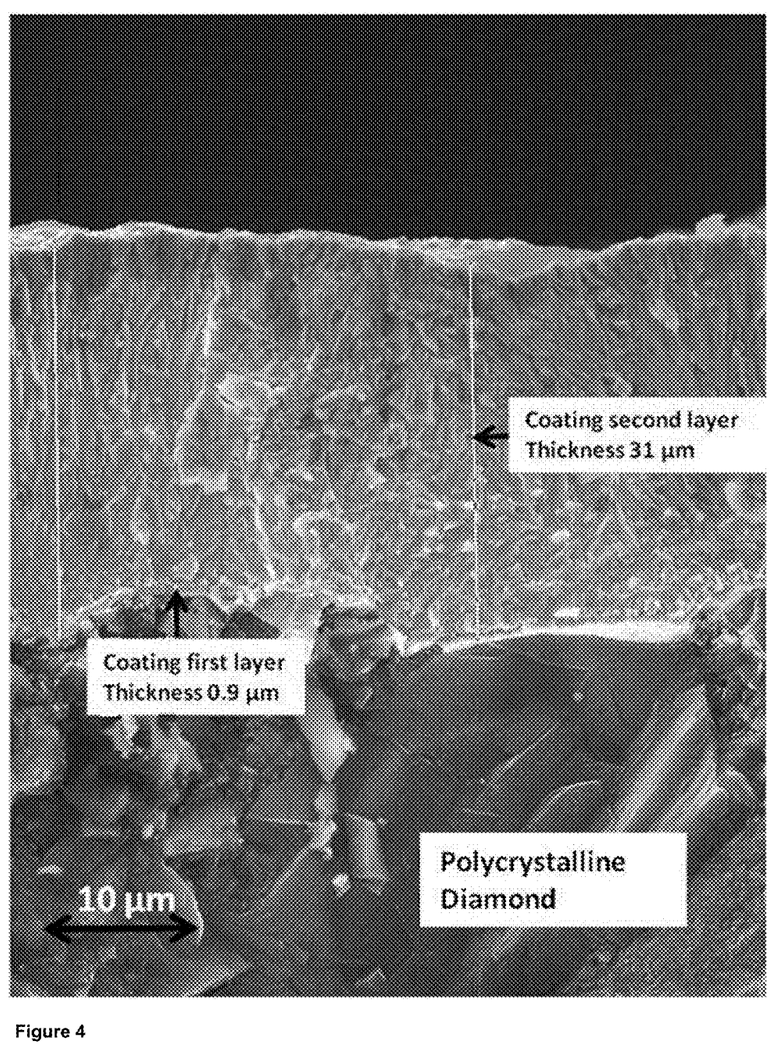
FIG. 4 is a scanning electron microscope image of a fracture cross-section of a coated TSP polycrystalline diamond as described in Example 1.

FIG. 4 is a scanning electron microscope (SEM) image of the fracture cross-section of a coated TSP polycrystalline diamond as described in Example 1 below. The coating comprises two layers. There is a first, adhesive layer with a thickness of 0.9 µm, having a fine microstructure, and consisting of a composite of tungsten with tungsten carbides, alloyed with fluorine. Overlaid on the first layer is a second, protective layer with a thickness of 31 µm, having a coarser columnar microstructure, and consisting of metal tungsten alloyed with fluorine.

Figure 5:
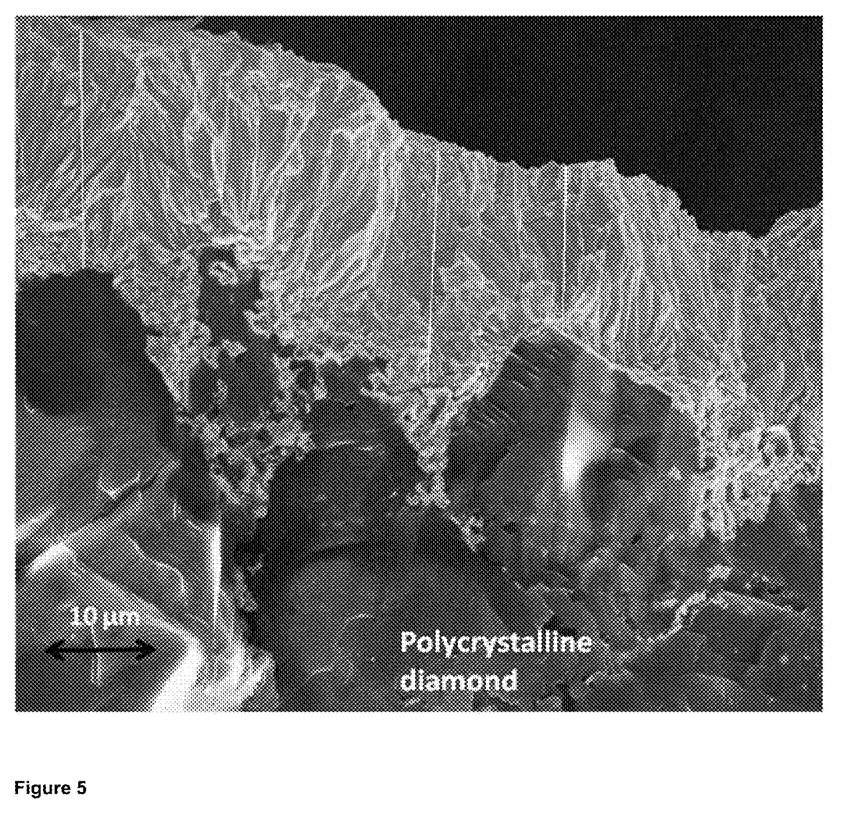
FIG. 5 is a scanning electron microscope image of a fracture cross-section of an alternative coated TSP polycrystalline diamond (as described in Example 3)

FIG. 5 is an SEM image of the fracture cross-section of an alternative coated TSP polycrystalline diamond. The coating comprises two layers. There is a first, adhesive layer with a fine microstructure, consisting of a composite of tungsten with tungsten carbides, alloyed with fluorine with thickness 0.8 µm. Overlaid on the first layer is a second, protective layer with a thickness of 30 to 27 µm, having a coarser columnar microstructure, and consisting of metal tungsten alloyed with fluorine. The coating has a strong adhesion bond to diamonds, as demonstrated by the fact that it remains adhered even after fracture of the coated diamond. The coating has a dense structure, free from porosity, and fills gaps and indentations in the uneven and porous surface of the polycrystalline diamond.

Figure 6:
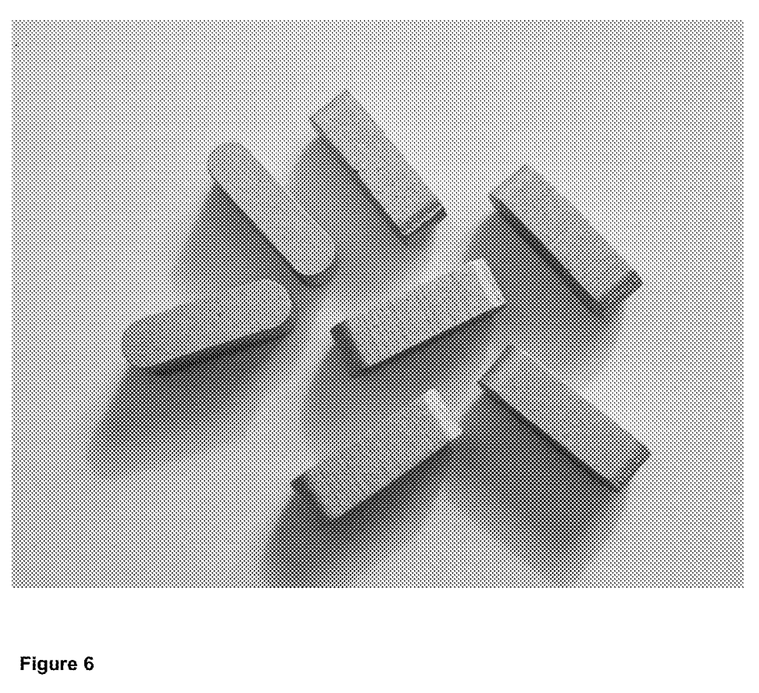
FIG. 6 shows a selection of coated TSP polycrystalline diamond elements, as described in Example 3 and FIG. 7 an X-ray diffraction spectrum for a first coating layer described in Example 9.

FIG. 6 is a photograph of coated TSP polycrystalline diamond elements as described in Example 3. The elements are uniformly coated all over, and have a silvery metal colour, with the external coating layer consisting of tungsten alloyed with fluorine.

Figure 7:
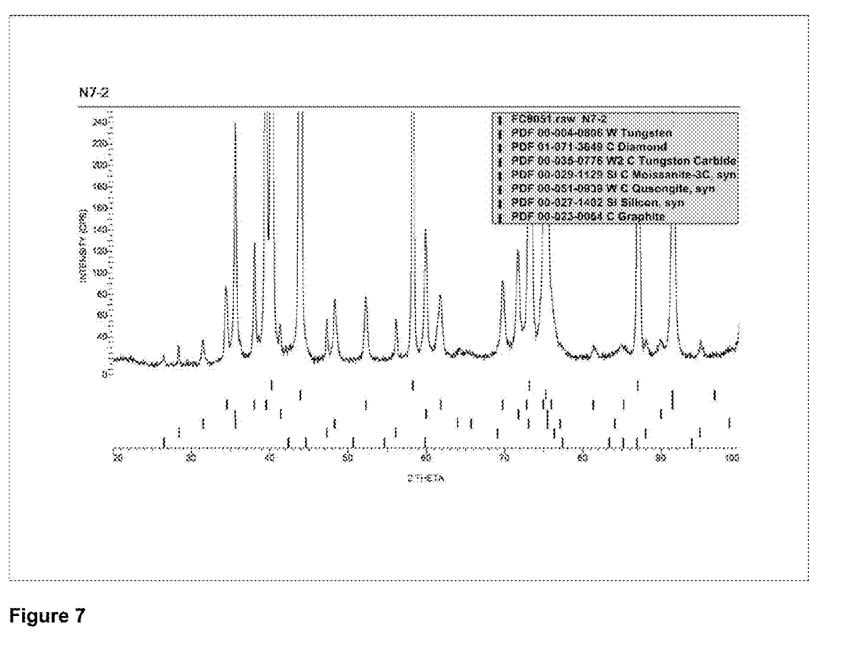

FIG. 7 shows a typical XRD pattern for the first layer coating produced as described in Example 9, the coating consists of a mixture of pure tungsten with Tungsten carbides WC and W$_2$C, alloyed with fluorine having a thickness of around 1.5 µm. The positions of the characteristic lines of the following materials are shown beneath the spectrum in the following order:
Tungsten W;
Diamond C;
Tungsten Carbide W$_2$C;
Silicon Carbide SiC;
Tungsten Carbide WC;
Silicon Si
Graphite C.
Because the first coating layer is relatively thin, the spectrum has the lines characteristic for both the substrate (Diamond, SiC, Si) and for the coating (Tungsten, Tungsten carbides WC and W$_2$C).

EXAMPLES

Example 1

Sintered TSP (Thermally Stable Polycrystalline Diamond) superabrasive diamond elements are mixed with a powdered tungsten metal charge with a fluorine content of 0.12 wt %, in a volume proportion of 1:6. The mixture is heated in a vacuum (0.013 Pa) at a temperature of 930° C. for 1.5 hours. As a result of this process, an adhesive layer is produced on diamond elements with a thickness of 0.9 µm and a roughness of 0.07 µm. The adhesive layer consists of a mixture of WC, W$_2$C and W, with a fluorine content of 0.025 wt %. The ratio of the WC, W$_2$C and W phases is 1:1:3. FIG. 1 shows the XRD spectrum of these coated TSP diamonds, showing lines both for the diamond substrate and for the WC, W$_2$C and W phases of the coating. The tungsten carbides in the coating were produced using carbon from the TSP diamond surface, which reacted with the tungsten in the powdered charge; there is no other source of carbon used in this process.

In order to provide the second, protective coating, the diamond elements with the adhesive coating are loaded into a CVD reactor chamber and kept in a reactive gas mixture of WF$_6$ and H$_2$ mixed in a volumetric proportion of 1:25 at a temperature of 550° C. and total pressure of 2 kPa for 2 hours. As a result of this second stage process, a second, protective coating layer is deposited. The second, protective coating layer consists substantially of tungsten alloyed with fluorine in an amount 0.015 wt % with a thickness of 31 µm and a hardness of 6 GPa. FIG. 2 shows the XRD spectrum of these TSP diamonds coated with a two layer coating. The spectrum shows only lines for tungsten, and does not have the lines characteristic for diamond and the tungsten carbide phases WC and W$_2$C. The second layer of the coating consists predominantly of tungsten alloyed with fluorine and is too thick to enable the XRD instruments detect characteristic lines of diamond or tungsten carbides from the first coating layer.

The two coating layers on the TSP diamonds together have a total thickness of 31.9 μm. The SEM image of the cross-section of the coated TSP diamond element is shown on FIG. 4. Both coating layers are visible, with the second thick layer having a coarse columnar structure, while the thin first layer has a much finer micro-crystalline structure.

Example 2

Natural diamond monocrystals with sizes 20-30 crystals per carat are mixed with a powdered metal tungsten charge with an inert filler and with a fluorine content of 0.9 wt %, in a volume proportion of diamond:tungsten:filler of 1:6:0.5. The mixture is heated in a vacuum (0.013 Pa) at a temperature of 970° C. for 1 hour. As a result of this process, an adhesive layer is produced on the diamonds with a thickness of 1.3 μm and a roughness of 0.1 μm. The adhesive layer consists of a mixture of WC, $W_2C$ and W, with a fluorine content of 0.014 wt %. The ratio of the WC, $W_2C$ and W phases is 2:1:3.

In order to provide the second, protective coating, the diamond elements with the adhesive coating are loaded into a CVD reactor chamber and kept in a reactive gas mixture of $WF_6$ and $H_2$ mixed in a volumetric proportion of 1:20 at a temperature of 450° C. and a total pressure of 4 kPa for 1.5 hours. As a result of this second stage process, a second, protective coating layer is deposited. The second, protective coating layer consists of tungsten alloyed with fluorine in an amount of 0.008 wt % with a thickness of 13 μm and a hardness of 6.7 GPa. Together, the two coating layers have a total thickness of 14.3 μm.

Example 3

Sintered TSP superabrasive diamond elements and a powdered tungsten metal charge with a fluorine content of 0.25 wt % are mixed in a volumetric proportion of 1:8. The mixture is heated in a vacuum (0.013 Pa) at a temperature of 830° C. for 2.5 hours. As a result of this process, an adhesive layer is produced on the diamond elements with a thickness of 0.8 μm. The adhesive layer consists of a mixture of WC, $W_2C$ and W, with a fluorine content of 0.036 wt %. The ratio of the WC, $W_2C$ and W phases is 1:2:2.

In order to provide the second, protective coating, the diamond elements with the adhesive coating are loaded into a CVD reactor chamber and kept in a reactive gas mixture of $WF_6$ and $H_2$ mixed in a volumetric proportion of 1:15 at a temperature of 600° C. and a total pressure of 2 kPa for 2.5 hours. The diamond elements were moved during the coating process, to ensure uniform coating all over. As a result of this second stage process, a second, protective coating layer is deposited. The second, protective coating layer consists of tungsten alloyed with fluorine in an amount of 0.009 wt % with a thickness of 20-27 μm and a hardness of 5.8 GPa. Together, the two coating layers have a total thickness of 21-28 μm. The coated TSP diamond elements are shown in FIG. 6.

One sample of the coated TSP diamond was broken for coating analysis, the cross section of one such element being shown in FIG. 5. The sintered polycrystalline diamond substrate has an uneven rough surface, and the coating covers the diamond surface completely, filling the gaps and crevices between the diamond grains. The innermost coating layer adjacent to the diamond surface has a finer micro-crystalline structure, while the outer coating layer has a coarser columnar micro-structure. Both coating layers contain tungsten, and the first layer additionally contains tungsten carbides. Both tungsten carbides and tungsten have low thermal expansion coefficients, closer to the thermal expansion coefficient of diamond, as compared to most other metals used in coatings for diamonds, such as titanium, chromium and nickel. The similarity of the chemical composition of both coating layers, as well as their thermal and mechanical properties, facilitate strong cohesion between the two layers and reduce the thermal mismatch and inherent stresses in the coatings. The coated TSP diamond element shown in FIG. 4 has the two coating layers clearly visible, but when the element was broken for analysis, the two layers remained strongly bonded together and adhered to the diamond surface. The fracture did not show any steps or gaps between the first and the second coating layers, nor were any areas of coating missing.

The coated TSP diamond elements were tested for brazing, using the following brazing alloys:

| Brazing alloy | Composition Percent | Liquidus T ° C. | Solidus T ° C. | Brazing T ° C. | Results |
|---|---|---|---|---|---|
| CB4 | Ag-70.50 Cu-26.50 Ti-3.00 | 850 | 780 | 900° C. 950° C. | Good wetting Good wetting |
| TiCuSil | Ag-68.8 Cu-26.7 Ti-4.5 | 900 | 780 | 900° C. 950° C. | Good wetting Good wetting |
| CuSil | Ag-63.0 Cu-35.25 Ti-1.75 | 815 | 780 | 900° C. 950° C. | Good wetting Good wetting |
| InCuSil | Ag-59.0 Cu-27.25 Ti-1.25 | 715 | 605 | 900° C. 950° C. | Good wetting Poor wetting |

Each alloy was tested at two brazing temperatures, 900° C. and 950° C., for 5 minutes. Most of the brazed elements showed good wetting of the coating by the brazing alloy and formation of a strong brazing bond, except for InCuSil samples brazed at the higher temperature of 950° C., which failed to wet the coating surface.

Example 4

Sintered polycrystalline superabrasive diamond disks, fully leached from metal catalyst, are mixed with a powdered metal tungsten charge with an inert filler containing 0.7 wt % of fluorine, in a volume proportion diamond:tungsten:filler of 1:6:0.6. The mixture is heated in a vacuum (0.013 Pa) at a temperature of 950° C. for 2 hours. As a result of this process, an adhesive layer is produced on the diamond discs with a thickness of 2.0 μm and a roughness of 0.12 μm. The adhesive layer consists of a mixture of WC, $W_2C$ and W, with a fluorine content of 0.055 wt %. The ratio of the WC, $W_2C$ and W phases is 1.5:1:3.

In order to provide the second, protective coating, the diamond elements with the adhesive coating are loaded into a CVD reactor chamber and kept in a reactive gas mixture of $WF_6$ and $H_2$ mixed in a volumetric proportion of 1:12 at a temperature of 550° C. and a total pressure of 2 kPa for 1.5 hours. As a result of this second stage process, a second, protective coating layer is deposited. The second, protective coating layer consists of tungsten alloyed with fluorine in an amount of 0.006 wt % with a thickness of 24 μm and a hardness of 5.7 GPa. Together, the two coating layers on the fully-leached PDC diamond disks have a total thickness of 26 μm.

The coated diamond disks were attached to cemented carbide WC/Co substrates using a High Temperature High Pressure press cycle. Molten cobalt metal binder from the substrate wetted the coated disk surface providing a strong bond. The thick two-layer coating provided a strong barrier against cobalt infiltration, so that the cobalt did not come into direct contact with the diamond surface. This prevented diamond graphitization catalysed by cobalt, and the coating therefore enhanced the thermal stability of the attached polycrystalline diamond disks.

Example 5

Synthetic diamond grit with grain sizes 400-315 microns is mixed with a powdered metal tungsten charge with a fluorine content of 0.3 wt %, in a volumetric proportion of 1:8. The mixture is heated in a vacuum (0.013 Pa) at a temperature of 930° C. for 1.5 hours. As a result of this process, an adhesive layer is produced on the diamonds with a thickness of 1.0 μm and a roughness of 0.07 μm. The layer consists of a mixture of WC, $W_2C$ and W, with a fluorine content of 0.017 wt %. The ratio of the WC, $W_2C$ and W phases is 1:1:3.

In order to provide the second, protective coating, the diamond elements with the adhesive coating are loaded into a CVD reactor chamber and kept in a reactive gas mixture of $WF_6$, $H_2$ and a hydrocarbon gas mixed in a volumetric proportion of 15:54:1 at a temperature of 500° C. and a total pressure of 2 kPa for 40 minutes. As a result of this second stage process, a second, protective coating layer is deposited. The second, protective coating layer consists of a tungsten metal matrix with dispersed tungsten carbide nanoparticles, alloyed with fluorine in an amount 0.008 wt % with a thickness of 25 μm and a hardness of 14.8 GPa.

Together, the two coating layers have a total thickness of 26 μm.

Example 6

Sintered polycrystalline TSP diamonds are mixed with a powdered metal tungsten charge with an inert filler with a fluorine content of 0.9 wt %, in a volume proportion of diamonds:tungsten:filler of 1:8:0.7. The mixture is heated in a vacuum (0.013 Pa) at a temperature of 900° C. for 2 hours. As a result of this process, an adhesive layer is produced on diamonds with a thickness of 1.0 μm and a roughness of 0.05 μm. The adhesive layer consists of a mixture of WC, $W_2C$ and W, with a fluorine content of 0.046 wt %. The ratio of the WC, $W_2C$ and W phases is 1:2:3.

In order to provide the second, protective coating, the diamond elements with the adhesive coating are loaded into a CVD reactor chamber and kept in a reactive gas mixture of $WF_6$, $H_2$ and a hydrocarbon gas mixed in a volumetric proportion of 11:40:1 at a temperature of 520° C. and a total pressure of 2 kPa for 30 minutes. As a result of this second stage process, a second, protective coating layer is deposited. The second, protective coating layer consists of a tungsten metal matrix with dispersed tungsten carbide nanoparticles, alloyed with fluorine in an amount 0.012 wt % with a thickness of 17 μm and a hardness of 17.5 GPa. Together, the two coating layers on the TSP diamonds have a total thickness of 18 μm.

Example 7

Sintered polycrystalline diamond disks, fully leached from metal catalyst, are mixed with a powdered tungsten metal charge with a fluorine content of 0.4 wt %, in the volume proportion of diamonds:tungsten of 1:7. The mixture is heated in a vacuum (0.013 Pa) at a temperature of 950° C. for 2 hours. As a result of this process, an adhesive layer is produced on the diamond disks with a thickness of 2.5 μm and a roughness of 0.15 μm. The layer consists of a mixture of WC, $W_2C$ and W, with a fluorine content of 0.026 wt %. The ratio of the WC, $W_2C$ and W phases in the coating layer is 1.5:1:3.

In order to provide the second, protective coating, the diamond elements with the adhesive coating are loaded into a CVD reactor chamber and kept in a reactive gas mixture of $WF_6$, $H_2$ and at some stages a hydrocarbon gas mixed in a volumetric proportion of 20:70:1 at a temperature of 520° C. and a total pressure of 2 kPa for a total of 90 minutes. The flow of the hydrocarbon gas was switched on and off for alternating periods of 5 minutes. As a result, the second coating layer is deposited as a layered structure, with alternating layers of tungsten and layers of tungsten metal matrix with dispersed tungsten carbide nanoparticles. Nine pairs of layers in total are deposited, all layers being alloyed with fluorine in an amount 0.017 wt %. The total thickness of the second coating is 50 μm, including tungsten layers each approximately 3 μm thick and layers of tungsten metal matrix with dispersed tungsten carbide nanoparticles each approximately 2 μm thick. The overall hardness of the coating is 12.0 GPa. Together, the two coating layers on the diamond disks have a total thickness of 52 μm.

Example 8

Synthetic diamond grit with grain sizes 400-315 microns is mixed with a powdered metal tungsten charge with a fluorine content of 0.2 wt %, in a volume proportion of 1:8. The mixture is heated in a vacuum (0.013 Pa) at a temperature of 850° C. for 2 hours. As a result of this process, an adhesive layer is produced on the diamonds with a thickness 0.8 μm and a roughness of 0.05 μm. The layer consists of a mixture of WC, $W_2C$ and W, with a fluorine content of 0.015 wt %. The ratio of the WC, $W_2C$ and W phases is 1:2:3.

In order to provide the second, protective coating, the diamond elements with the adhesive coating are loaded into a CVD reactor chamber and kept in a reactive gas mixture of $WF_6$, $H_2$ and a hydrocarbon gas mixed in a volumetric proportion of 22:77:1 at a temperature of 510° C. and a total pressure of 2 kPa for 40 minutes. As a result of this second stage process, a second, protective coating layer is deposited. The second, protective coating layer consists of a tungsten metal matrix with dispersed tungsten carbide nanoparticles, alloyed with fluorine in an amount 0.008 wt % with a thickness of 20 μm and a hardness of 11.0 GPa. Together, the two coating layers have a total thickness of 20.8 μm.

Example 9

TSP polycrystalline diamond elements were loaded in a CVD reactor chamber and kept in a reactive gas mixture of $WF_6$, and $H_2$ mixed in a volumetric proportion of 1:2 at a temperature of 590° C. and a total pressure of 2 kPa for 30 minutes. As a result of this first stage process, a layer of tungsten alloyed with fluorine is deposited, with a thickness of 1.5 μm. The coated diamond elements were then heated in a vacuum (0.013 Pa) to a temperature of 920° C. for 2 hours. As a result of this process, an adhesive layer is produced on the diamonds with a thickness 1.5 μm. The layer consists of a mixture of WC, $W_2C$ and W, with a fluorine content of 0.024 wt %. The X-ray diffraction spectrum of these diamond elements is shown in FIG. 7, demonstrating a layer comprising metal tungsten, tungsten monocarbide WC and tungsten semicarbide $W_2C$, with spectra of diamond, silicon and silicon carbide from the sintered TSP polycrystalline diamond substrate. The ratio of the $W/W_2C/WC$ phases based upon measuring the peak intensities of the three peaks for W, $W_2C$ and WC is 45:5:1.

In order to provide the second, protective coating, the diamond elements with the adhesive coating are loaded into a CVD reactor chamber and kept in a reactive gas mixture of $WF_6$, $H_2$ and a hydrocarbon gas mixed in a volumetric proportion of 2:7:2 at a temperature of 510° C. and a total pressure of 2 kPa for 47 minutes. As a result of this second stage process, a second, protective coating layer is deposited. FIG. 3 shows an X-ray diffraction spectrum of the coated diamond elements. The second, protective coating layer consists of a mixture of tungsten with tungsten carbides WC and $W_2C$, alloyed with fluorine in an amount 0.008 wt % with a thickness of 15 µm and a hardness of 21.0 GPa. Together, the two coating layers have a total thickness of 16.5 µm.

Throughout the description and claims of this specification, the words "comprise" and "contain" and variations of them mean "including but not limited to", and they are not intended to (and do not) exclude other moieties, additives, components, integers or steps. Throughout the description and claims of this specification, the singular encompasses the plural unless the context otherwise requires. In particular, where the indefinite article is used, the specification is to be understood as contemplating plurality as well as singularity, unless the context requires otherwise.

Features, integers, characteristics, compounds, chemical moieties or groups described in conjunction with a particular aspect, embodiment or example of the invention are to be understood to be applicable to any other aspect, embodiment or example described herein unless incompatible therewith. All of the features disclosed in this specification (including any accompanying claims, abstract and drawings), and/or all of the steps of any method or process so disclosed, may be combined in any combination, except combinations where at least some of such features and/or steps are mutually exclusive. The invention is not restricted to the details of any foregoing embodiments. The invention extends to any novel one, or any novel combination, of the features disclosed in this specification (including any accompanying claims, abstract and drawings), or to any novel one, or any novel combination, of the steps of any method or process so disclosed.

The invention claimed is:

1. A coating on mono- or poly-crystalline diamond or diamond-containing material, the coating comprising:
    a first layer formed directly on the diamond or diamond-containing material, the first layer comprising a composite structure, wherein the composite structure consists essentially of a dispersed mixture of metal tungsten, tungsten monocarbide, and tungsten semicarbide phases, and wherein the mixture is alloyed with fluorine in an amount of 0.001 to 0.12 wt % calculated on the total weight of the first layer; and
    a second layer formed on the first layer, the second layer comprising at least tungsten alloyed with fluorine in an amount of 0.001 to 0.12 wt % calculated on the total weight of the second layer.

2. The coating as claimed in claim 1, wherein the second layer comprises tungsten and tungsten carbide alloyed with fluorine in an amount of 0.001 to 0.12 wt % calculated on the total weight of the second layer.

3. The coating as claimed in claim 1, wherein the first layer has a micro-crystalline grain structure and the second layer has a columnar grain structure.

4. The coating as claimed in claim 1, wherein carbon in the tungsten carbide of the first layer is derived from the diamond or diamond-containing material on which the first layer is formed.

5. The coating as claimed in claim 1, wherein the second layer is a chemically-deposited layer.

6. The coating as claimed in claim 1, wherein the first layer is a chemically-deposited layer.

7. The coating as claimed in claim 1, wherein the first layer has a thickness of 0.1 to 4 µm.

8. The coating as claimed in claim 1, wherein the first layer has a phase content of WC phase up to 94% by volume, $W_2C$ phase from 5 to 20% by volume, and the balance W phase.

9. The coating as claimed in claim 1, wherein the second layer includes at least one of tungsten monocarbide (WC) and tungsten semicarbide ($W_2C$).

10. The coating as claimed in claim 1, wherein the second layer includes tungsten carbide nanoparticles dispersed in a matrix of metal tungsten, alloyed with fluorine in an amount of 0.001 to 0.12 wt %.

11. The coating as claimed in claim 1, wherein the second layer is itself formed as a plurality of alternating sublayers of tungsten carbide alloyed with fluorine and tungsten alloyed with fluorine.

12. The coating as claimed in claim 11, wherein the sublayers of tungsten carbide alloyed with fluorine are each less than 4 µm in thickness.

13. The coating as claimed in claim 1, wherein the second layer is itself formed as a plurality of alternating sublayers of tungsten alloyed with fluorine, and tungsten carbide nanoparticles dispersed in a matrix of metal tungsten, alloyed with fluorine.

14. The coating as claimed in claim 13, wherein the sublayers of tungsten carbide nanoparticles dispersed in a matrix of metal tungsten are each less than 4 µm in thickness.

15. The coating as claimed in claim 11, wherein the sublayers have a respective thickness ratio from 10:1 to 1:10.

16. The coating as claimed in claim 1, wherein the second layer has a thickness of 0.5 to 500 µm.

17. The coating as claimed in claim 16, wherein the second layer has a thickness of 3 to 50 µm.

18. The coating as claimed in claim 1, formed on diamond or diamond-containing material comprising diamond, mono-crystalline diamond, poly-crystalline diamond, diamond-silicon carbide composites or other diamond-containing materials substantially free from metal catalysts and being thermally stable at temperatures up to at least 800° C.

19. The coating as claimed in claim 1, wherein the diamond or diamond-containing material is substantially completely coated.

20. The coating as claimed in claim 1, wherein the diamond or diamond-containing material is substantially completely coated except for portions where it has been held during coating.

21. The coating as claimed in claim 1, wherein the first and second layers are substantially free from through porosity and/or through cracks.

22. The coating as claimed in claim 1, wherein the first and second layers together consist of 93.88 to 99.95 wt % tungsten.

23. The coating as claimed in claim 1, wherein the first and second layers are free from non-refractory binder materials.

24. The coating as claimed in claim 1, the coating having a hardness from 4.0 to 25 GPa.

25. The coating as claimed in claim 1, the coating having a hardness from 6 to 18 GPa.

26. A superabrasive element comprising mono- or poly-crystalline diamond or diamond-containing material coated with the coating of claim 1.

27. A cutting or drilling tool incorporating at least one superabrasive element as claimed in claim 26.

28. A method for producing a cutting or drilling tool, comprising:
Coating a mono- or poly-crystalline diamond or diamond-containing material with a coating comprising:
a first adhesive layer formed directly on the diamond or diamond-containing material, the first adhesive layer comprising a composite structure, wherein the composite structure consists essentially of a dispersed mixture of metal tungsten, tungsten monocarbide, and tungsten semicarbide phases, and wherein the mixture is alloyed with fluorine in an amount of 0.001 to 0.12 wt % calculated on the total weight of the first adhesive layer; and a second protective layer formed on the first adhesive layer, the second protective layer comprising at least tungsten alloyed with fluorine in an amount of 0.001 to 0.12 wt % calculated on the total weight of the second protective layer;
attaching a superabrasive element to a tool substrate by wetting the second, protective layer of the coating with molten material.

29. The method according to claim 28, wherein the metal is selected from the group consisting of: cobalt, nickel, iron, copper, titanium, silver, gold, aluminum, indium, and alloys containing at least two of the foregoing metals.

30. The method according to claim 28, wherein the molten metal is applied by way of infiltration, casting, brazing, spraying, welding, soldering, Hot Isostatic Pressing (HIP) or High Temperature High Pressure (HTHP) cycling.

31. A method of applying a coating to a substrate comprising mono- or poly-crystalline diamond or diamond-containing material, the method comprising:
forming a first adhesive layer directly on the substrate by a first stage chemical deposition process, the first adhesive layer comprising a composite structure, wherein the composite structure consists essentially of a disperse mixture of metal tungsten, tungsten monocarbide, and tungsten semicarbide phases, and wherein the mixture is alloyed with fluorine in an amount of 0.001 to 0.12 wt % calculated on the total weight of the first adhesive layer; and
forming a second protective layer on the first adhesive layer by a second stage chemical deposition process, the second protective layer comprising at least tungsten alloyed with fluorine in an amount of 0.001 to 0.12 wt % calculated on the total weight of the second protective layer.

32. The method according to claim 31, wherein the first stage chemical deposition process comprises placing the substrate in a carbon-free solid powder medium comprising metallic tungsten powder and fluorides in an amount of 0.1 to 10 wt %, heating in a vacuum or an inert gas atmosphere, and holding at a temperature of 800 to 1050° C. for at least 10 minutes to form the first adhesive layer.

33. The method according to claim 31, wherein the first stage chemical deposition process comprises placing the substrate in a gaseous medium comprising $WF_6$ and hydrogen at a volumetric ratio of tungsten hexafluoride to hydrogen ranging from 3:5 to 1:10, at a temperature of 400 to 600° C. and a pressure of 0.5 to 20 kPa for at least 2 minutes to produce a layer of tungsten alloyed with fluorine in an amount from 0.001 to 0.12 wt %, with a thickness of at least 0.1 μm, followed by heat treatment at a temperature between 800° C. and 1000° C. for at least 10 minutes to form the first adhesive layer.

34. The method according to claim 33, wherein the layer of tungsten alloyed with fluorine is applied to a thickness up to 100 μm.

35. The method according to claim 31, wherein the second stage chemical deposition process comprises placing the substrate coated with the first adhesive layer in a gaseous medium comprising $WF_6$, hydrogen and optionally hydrocarbons, at a temperature of 350 to 600° C. and a partial pressure of 0.1 to 20 kPa for at least 10 minutes to form the second protective layer.

36. The method according to claim 31, wherein at least one of the coatings is deposited by way of vapor phase deposition, the vapor being non-ionized and chemically active during the deposition process, with the substrate being moved during the deposition process so as to obtain complete coating over the entire substrate surface.

37. The method according to claim 31, wherein the substrate comprises diamond or diamond-containing grit or elements.

* * * * *